United States Patent [19]

Flores

[11] Patent Number: 5,214,565

[45] Date of Patent: May 25, 1993

[54] FUSE HOLDER HEAT SINK BRACKET

[75] Inventor: Michael A. Flores, Dallas, Tex.

[73] Assignee: Fujitsu Network Transmission Systems, Inc., Richardson, Tex.

[21] Appl. No.: 828,696

[22] Filed: Jan. 31, 1992

[51] Int. Cl.⁵ .............................................. H05K 7/20
[52] U.S. Cl. ................................... 361/386; 361/347; 361/357; 361/388; 361/392; 361/427; 361/430; 361/431; 337/216; 174/163 R; 165/80.3; 165/185
[58] Field of Search ............... 361/380, 383, 386, 388, 361/390, 391, 392, 393, 394, 395, 399, 427, 430, 431, 347, 349, 357, 360; 165/80.3, 185; 337/216, 227, 228, 106; 174/163; 357/81

[56] References Cited

U.S. PATENT DOCUMENTS 4,172,271 10/1979 Hobson, Jr. .......................... 361/347
4,203,488 5/1980 Johnson et al. ..................... 165/80.3

Primary Examiner—Leo P. Picard
Assistant Examiner—Young S. Whang
Attorney, Agent, or Firm—Staas & Halsey

[57] ABSTRACT

A bracket for fuse holders includes heat sink fins for cooling the fuse holders. The bracket has a main body conforming to the shape of the fuse holders and mounting members or feet which can be attached, using self-clinching nuts, to a printed circuit board on which the fuse holders are mounted. The heat sink is formed of fins attached to the main body. When space is limited, the fins preferably have a rectangular U-shape to provide increased cooling area. The main body provides structural rigidity to prevent the fuse holders from being dislodged due to torquing of the fuse holder caps.

9 Claims, 2 Drawing Sheets

FUSE HOLDER HEAT SINK BRACKET

BACKGROUND OF THE INVENTION

1. Field of the Invention

The present invention is directed to a bracket for securing fuse holders to a printed circuit board and, more particularly, to such a bracket which provides heat dissipation.

2. Description of the Related Art

In most electronic devices of any size, proper cooling of the device is an important consideration. Active devices, such as transistors and integrated circuits conventionally are provided with heat sinks when necessary. However, typically no such provision is made for passive devices such as fuses.

In addition, to provide for easy replacement of fuses, fuse holders in a device are usually provided with connection to a printed circuit board at a location which permits external access to the fuses within after the device has been assembled. Fuse replacement is often repetitious due to uncertain fuse life Therefore, mounted fuse holders must be able to withstand the forces required to replace the fuses. As a result, secure mounting of the fuse holders in a manner which permits efficient manufacture of devices is not easily accomplished.

SUMMARY OF THE INVENTION

An object of the present invention is to provide mechanical support for fuse holders connected to a printed circuit board.

Another object of the present invention is to provide heat dissipation for fuse holders.

The above objects are attained by providing a bracket for fuse holders attached to a support, comprising: a main body having a shape conforming to a plurality of the fuse holders; mounting means for mounting the bracket on the support; and heat sink means for cooling the main body. Preferably, when the fuse holders have a rectangular cross section the main body has a rectangular U-shape with a base and two sides. The heat sink means is provided by fins attached to the base and extending from one side of the main body to the other. When space is limited, the fins may have a rectangular U-shape with a base and two sides. In this embodiment, the fins are integrally formed with the main body and are each connected at an edge of one of the fin's sides opposite the base of the fin.

These objects, together with other objects and advantages which will be subsequently apparent, reside in the details of construction and operation more fully hereinafter described and claimed, reference being had to the accompanying drawings forming a part hereof, wherein like reference numerals refer to like parts throughout.

DESCRIPTION OF THE PREFERRED EMBODIMENT

Figure 1A:
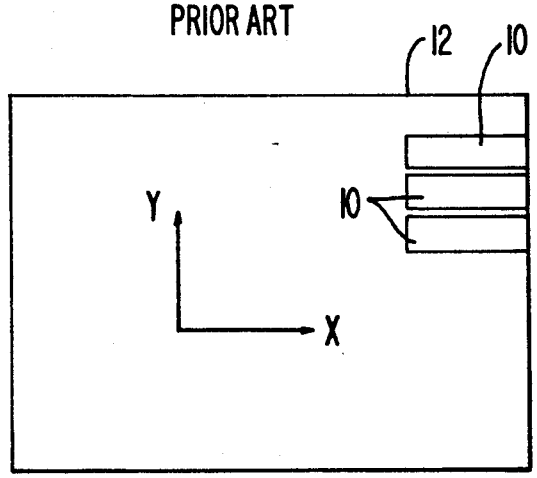
FIGS. 1A and 1B are plan and side views of a printed circuit board with fuse holders attached in a known manner.
Figure 1B:
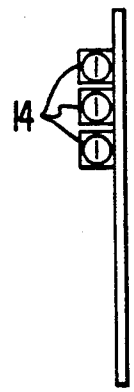
Figure 2:
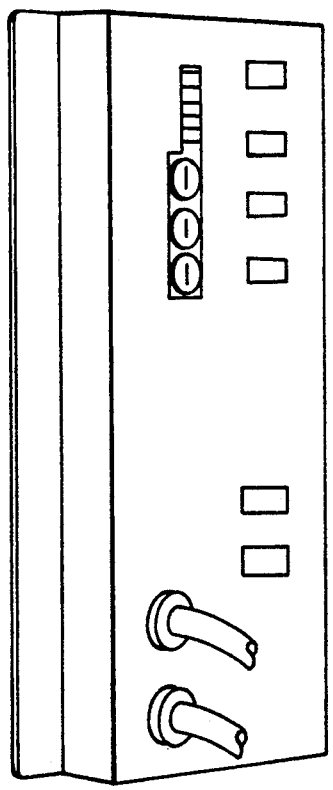
FIG. 2 is a three-dimensional external view of a device which can incorporate the present invention.

As illustrated in FIGS. 1A and 1B, conventionally rectangular fuse holders 10, such as Model 345-101 from LITTELFUSE, Inc., are soldered to a conventional printed circuit board 12. As illustrated in FIGS. 1B and 2, these fuse holders with which the preferred embodiment is used, have internally threaded holes with access knobs or caps 14. The ability of the solder points of the fuse holders lo to withstand torquing of the caps 14 is dependent upon how securely the fuse holders 10 are soldered to the printed circuit board 12. Experience has shown that the fuse holder solder points are not always able to withstand repeated changes in fuses.

Figure 3:
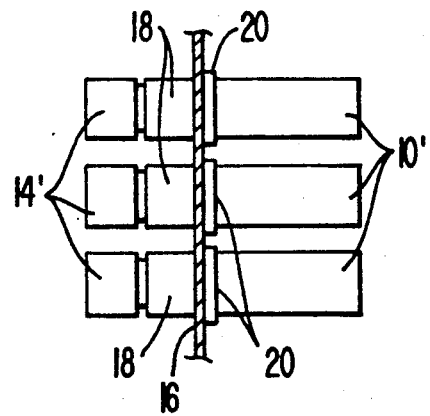
FIG. 3 is a side view of panel-mounted fuse holders according to the prior art.

An alternative method of mounting fuse holders which overcomes the drawbacks of the technique illustrated in FIGS. 1A and 1B is illustrated in FIG. 3. The fuse holders 10' are secured to a panel 16 by a collar 18 on the exterior of the panel 16 and a back nut 20 on the interior of the panel 16. This solves the problem of resistance to torquing, but creates manufacturing complexity due to increased difficulty in providing electrical connection between the fuse holders 10' and electronic components, such as those mounted on the printed circuit board 12 in the device. In addition, reliability is reduced due to the possibility of breaking the electrical connection between the fuse holders and the electronic components.

Figure 4A:
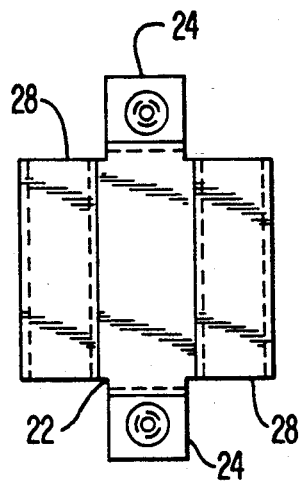
FIGS. 4A-4C are plan, end and side views, respectively, of a fuse holder heat sink bracket according to the present invention.
Figure 4B:
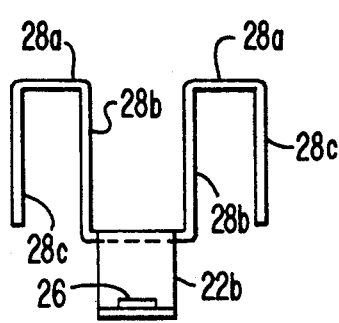
Figure 4C:
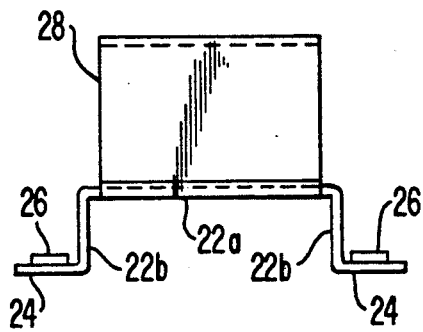
Figure 5:
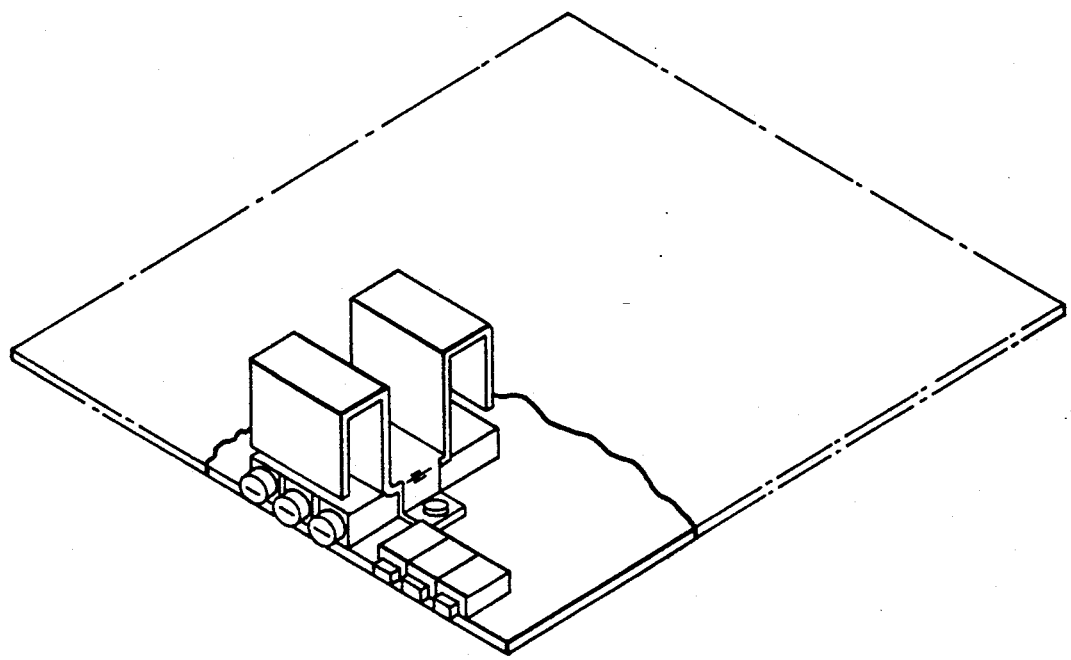
FIG. 5 is a three-dimensional view of a printed circuit board on which a fuse holder heat sink bracket according to the present invention has been mounted.

The present invention overcomes the drawbacks of both the attachment technique illustrated in FIGS. 1A and 1B and the attachment technique illustrated in FIG. 3 by using a bracket having the preferred embodiment illustrated in FIGS. 4A-4C. As most easily seen in the side view FIG. 4C, a fuse holder heat sink bracket according to the present invention includes a main body 22 which is shaped to conform to the fuse holders in the device. When fuse holders like holders 10 illustrated in FIGS. 1A and 1B are used, the main body has a rectangular U-shape like that illustrated in FIG. 4C with a base 22a and sides 22b. If the fuse holders were round, the main body 22 would be formed to fit snugly and additional fastening means could be used to attach the fuse holders to the main body 22 of the bracket.

Integrally formed as part of the bracket are mounting members or feet 24 which provide mounting means for attachment to the printed circuit board 12. The mounting members 24 may be attached by any secure fastener; however, in the preferred embodiment the mounting members 24 are attached to the printed circuit board 12 using self-clinching nuts 26 and screws (not shown). The self-clinching nuts 26 may be pressed or otherwise attached to the mounting members 24 so that conventional screws may be used from the underside of the printed circuit board.

Conventionally, the extent of cooling of fuse holders is dependent upon the body of the fuse holder alone. According to the present invention an integral part of the bracket are fins 28 which provide heat sink means for cooling the main body 22 and, by conduction, the fuse holders and fuses within. Any known heat sink fin design may be used, but in the illustrated embodiment a type of folded fin is used due to space limitations and for ease of construction of the bracket. As most clearly illustrated in FIG. 4B, in the illustrated embodiment, the fins have a U-shape with a base 28a and sides 28b, 28c. As best illustrated in FIG. 4B, one of the sides 28b of each of the fins 28 meets the base 22a of the main body 22 at a corner. The fins 28 extend substantially the full length of the base 22a between the sides 22b of the main body 22.

A bracket constructed as illustrated in FIGS. 4A–4C dissipates heat according to the following equation (1), $$q_{lost} = (1/mb) \cdot \tanh(mb) \cdot h_c \cdot A \cdot \Delta t \qquad (1)$$

where m is the fin performance factor, b is the fin height, $h_c$ is the free convection coefficient for vertical surfaces, A is the area of the fins and $\Delta t$ is the temperature difference between the base of the fin and the coolant, i.e., the ambient air temperature. The fin performance factor m may be calculated using equation (2), where k is the thermal conductivity of the fins and T is the fin thickness.

$$m = \sqrt{2h_c/kT} \qquad (2)$$

In the preferred embodiment the bracket, including the fins 28, is made of 5052 aluminum which has a thermal conductivity of 80.09 BTU/hr-ft-° F. In a test of the preferred embodiment with an ambient temperature of 73.4° F. and a main body temperature of 212° F., a fin 28 having a height (measured perpendicular to the main body) of 0.99 inches and a length (measured parallel to the base 22a of the main body) of 1.38 inches dissipated 2.81 watts. Other sizes or configurations of fins may be used depending upon the heat to be dissipated, the ambient air temperature and the maximum acceptable temperature for the main body 22. Other adjustments can be made for other changes as known to one of ordinary skill in the art of fin design for heat sinks.

The many features and advantages of the present invention are apparent from the detailed specification, and thus it is intended by the appended claims to cover all such features and advantages of the apparatus which fall within the true spirit and scope of the invention. Further, since numerous modifications and changes will readily occur to those skilled in the art from the disclosure of this invention, it is not desired to limit the invention to the exact construction and operation illustrated and described. For example, the main body of the bracket will have a different shape if the cross-section of the fuse holders is not rectangular. Accordingly, suitable modifications and equivalents may be resorted to, as falling within the scope and spirit of the invention.

I claim:

1. A bracket for fuse holders attached to a printed circuit board, comprising:
    a main body having a U-shape, conforming to the fuse holders, with a base and two sides, and having first and second ends, roughly parallel to each other and roughly perpendicular to said base at the first ends;
    mounting means, including feet, disposed roughly parallel to said base, one of the feet integrally formed at the second end of each side, for mounting said bracket on the printed circuit board; and
    heat sink means, including fins integrally formed on said main body, for cooling said main body.

2. The bracket as recited in claim 1, wherein said bracket is formed from a single piece of sheet metal, each of said fins meeting the base of said main body at the corner extending between the sides of said main body.

3. The bracket as recited in claim 2, wherein said fins are U-shaped, each having a base and two sides, one of the sides of each fin meeting the base of said main body at the corner formed therebetween.

4. A fuse holder assembly, comprising:
    fuse holders, each having a removable cap at one end, with a composite cross-sectional shape in a plane parallel to the end of each fuse holder; and
    a bracket, including—
        a main body having a U-shape conforming to the composite crosssectional shape of the fuse holders, with a base and two sides, and having first and second ends, roughly parallel to each other and roughly perpendicular to the base at the first ends;
        feet disposed roughly parallel to the base, one of the feet integrally formed at the second end of each side; and
        fins integrally formed on the main body for cooling the main body.

5. The fuse holder as recited in claim 4,
    wherein said fuse holders each have a rectangular external cross-section, whereby the composite cross-sectional shape of said fuse holders is rectangular, and
    wherein each of the sides of the main body of said bracket is substantially perpendicular to the base thereof.

6. The fuse holder as recited in claim 5, wherein each fin has two sides with one side attached to the base of the main body and extending between the sides of the main body of said bracket.

7. A fuse protected device, comprising:
    a cabinet having a panel with fuse access holes;
    a printed circuit board, mounted in said cabinet, having an edge adjacent the fuse access holes in the panel of said cabinet;
    fuse holders, attached to said printed circuit board, having a removable cap aligned with one of the fuse access holes of said cabinet, said fuse holders having a composite cross-sectional shape in a plane parallel to the panel with the fuse access holes in said cabinet; and
    a bracket, including—
        a main body having a U-shape conforming to the composite cross-sectional shape of the fuse holders, with a base and two sides, and having first and second ends, roughly parallel to each other and roughly perpendicular to the base at the first ends;
        feet disposed roughly parallel to the base, one of the feet integrally formed at the second end of each side; and
        fins integrally formed on the main body for cooling the main body.

8. The fuse protected device as recited in claim 7, wherein each fin has two sides with one side attached to the base of the main body and extending between the sides of the main body of said bracket.

9. The fuse protected device as recited in claim 7, wherein the sides of the heat sink of said bracket are disposed substantially parallel to air flow in said cabinet at the edge of said printed circuit board adjacent the fuse access holes.

* * * * *